(12) United States Patent
Chen et al.

(10) Patent No.: US 11,023,172 B2
(45) Date of Patent: Jun. 1, 2021

(54) SELECTING READ VOLTAGE USING WRITE TRANSACTION DATA

(71) Applicant: Micron Technology, Inc., Boise, ID (US)

(72) Inventors: Zhengang Chen, San Jose, CA (US); Tingjun Xie, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/523,851

(22) Filed: Jul. 26, 2019

(65) Prior Publication Data

US 2021/0026562 A1     Jan. 28, 2021

(51) Int. Cl.
| | | |
|---|---|---|
| *G06F 12/00* | (2006.01) | |
| *G06F 3/06* | (2006.01) | |
| *G11C 16/10* | (2006.01) | |
| *G06F 16/245* | (2019.01) | |
| *G11C 16/26* | (2006.01) | |

(52) U.S. Cl.
CPC .......... *G06F 3/0659* (2013.01); *G06F 3/0604* (2013.01); *G06F 3/0673* (2013.01); *G06F 16/245* (2019.01); *G11C 16/10* (2013.01); *G11C 16/26* (2013.01)

(58) Field of Classification Search
CPC .... G06F 3/0659; G06F 16/245; G06F 3/0604; G06F 3/0673; G11C 16/10; G11C 16/26
See application file for complete search history.

(56) References Cited

U.S. PATENT DOCUMENTS

| | | | |
|---|---|---|---|
| 10,101,931 B1 | 10/2018 | Camp et al. | |
| 2013/0036261 A1* | 2/2013 | Kim | G06F 11/1048 711/103 |
| 2013/0073807 A1 | 3/2013 | Radke et al. | |
| 2014/0325123 A1* | 10/2014 | Higeta | G06F 12/0246 711/103 |
| 2015/0113322 A1* | 4/2015 | Lee | G11C 29/021 714/15 |
| 2015/0179284 A1* | 6/2015 | Alrod | G06F 11/1044 714/704 |
| 2015/0370493 A1* | 12/2015 | Choi | G06F 3/0619 711/103 |

(Continued)

OTHER PUBLICATIONS

PCT Notification of Transmittal of the International Search Report and the Written Opinion of the International Searching Authority for PCT Application No. PCT/US2020/043553, dated Nov. 6, 2020, 11 pages.

*Primary Examiner* — John A Lane
(74) *Attorney, Agent, or Firm* — Lowenstein Sandler LLP (57) ABSTRACT

A system includes a memory component; and a processing device, operatively coupled with the memory component. The processing device is to receive a request to perform a read operation on data stored at a physical address of the memory component and determine whether the data satisfies a threshold criterion pertaining to when the data was written to the physical address. In response to the data satisfying the threshold criterion, the processing device is to perform the read operation on the data stored at the physical address using a first read voltage level, and in response to the data not satisfying the threshold criterion, perform the read operation on the data stored at the physical address using a second read voltage level.

19 Claims, 7 Drawing Sheets

(56) References Cited

U.S. PATENT DOCUMENTS

| | | |
|---|---|---|
| 2016/0034395 A1 | 2/2016 | Isherwood et al. |
| 2016/0118129 A1* | 4/2016 | Muchherla ......... G11C 16/0466 365/185.12 |
| 2016/0170664 A1* | 6/2016 | Suzuki ................ G11C 29/021 711/103 |
| 2016/0179415 A1 | 6/2016 | Lee et al. |
| 2019/0012228 A1* | 1/2019 | Hsiao .................... G06F 11/073 |
| 2020/0042237 A1* | 2/2020 | Zeng ..................... G06F 3/0619 |
| 2020/0159447 A1* | 5/2020 | Luo ..................... G11C 16/3404 |

* cited by examiner

SELECTING READ VOLTAGE USING WRITE TRANSACTION DATA

TECHNICAL FIELD

Embodiments of the disclosure relate generally to memory sub-systems, and more specifically, relate to selecting a read voltage using write transaction data.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to selecting a read voltage using write transaction data. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as non-volatile memory devices. The host system can provide data to be stored at the memory sub-system and can request data to be retrieved from the memory sub-system.

A bit error rate (BER) for certain memory device types (i.e., for memory sub-systems employing certain types of memory devices), can vary over time. The BER can be the number of bit errors detected per unit of time that the data stored at a data block experiences. In particular, some non-volatile memory devices (e.g., NAND, phase change, etc.) have threshold voltage (Vt) distributions that move as a function of time. At a given read level (i.e., the voltage applied to a memory cell as part of a read operation), if the Vt distributions move, then the BER can also be affected. For any Vt distribution at an instance in time, there can an optimal read level (or read level range) that minimizes the expected BER. In particular, for some types of memory devices, the Vt distribution and BER can be a function of write-to-read (W2R) delay (i.e., the period of time that passes between when data is written to a memory device and when the data is read from the memory device). Due to this time-varying nature of BER, as well as other noise mechanisms in memory, a single read level may not be sufficient to achieve an error rate that satisfies certain system reliability targets. Thus, certain memory sub-systems may have a number of pre-programmed read voltage levels, each corresponding to a different range of W2R delay times. For example, a lowest read voltage can be most advantageous (lowest BER) to use for very small write to read delays, a second higher read voltage can have the lowest BER for data with a W2R delay that is slightly larger, and a third read voltage can have the lowest BER for data with a W2R delay that is very large.

A conventional memory sub-system can read data from non-volatile memory, selecting the lowest read voltage level first to attempt to read the data. If a read error occurs when using the lowest read voltage level, then the next highest read voltage level is selected to attempt to read the data. Again, if a read error occurs, then another higher read voltage level is used to read the data. Beginning with the lowest read voltage, and then progressing to higher read voltages helps to prevent corruptive reads and partial writes caused by applying a read voltage that is too high. This technique, however, can reduce system performance by increasing latency of memory read access since all three voltage levels are typically tried before getting to a correct read voltage for data with a large write to read delay.

Aspects of the present disclosure address the above and other deficiencies by using write transaction data to select an appropriate read voltage level to use. The memory sub-system can include a write transaction catalog, which is a data structure that includes entries that store write transaction data, such as the physical addresses associated with write transactions that have occurred within a particular range of W2R delay. When a request to perform a read operation is received, the memory sub-system can examine the write transaction catalog for an entry corresponding to the physical address on which the read operation is to be performed. If the physical address is in the write transaction catalog, then a range of W2R delay can be determined for the data at the physical address. A read voltage level can then be selected based on the W2R delay of the data at the physical address.

In one example, a physical address associated with a write transaction is recorded in the write transaction catalog. Upon receiving a request to read data stored at the physical address, if the physical address is recorded in the write transaction catalog then a first read voltage level is selected to read the data at the physical address. If the physical address is not recorded in the write transaction catalog then a second read voltage is selected. In another example, upon receiving a request to perform a write transaction, a physical address associated with the write transaction is recorded in the write transaction catalog along with a time stamp of when the write transaction occurred. Then upon receiving a request to read the data at the physical address, the write transaction catalog is searched. If the physical address is found in the write transaction catalog, a difference between the time stamp stored with the physical address and the current read request is determined. If the difference (i.e. the W2R delay) is less than a threshold write to read delay then the first read voltage is selected, otherwise the second read voltage is selected. It should be noted that any number of threshold write to read delays can be used to select any number of read voltages. For example, more than one threshold write to read delay can be used to select between three or more read voltages.

Thus, the present disclosure provides advantages over conventional systems by selecting a read voltage using a write transaction catalog. The read-retry trigger rate is reduced which can improve overall system throughput and reduce latency. Additionally, partial write effects can be reduced or eliminated thus ensuring that the system continues to meet the reliability requirements of the host system.

Figure 1:
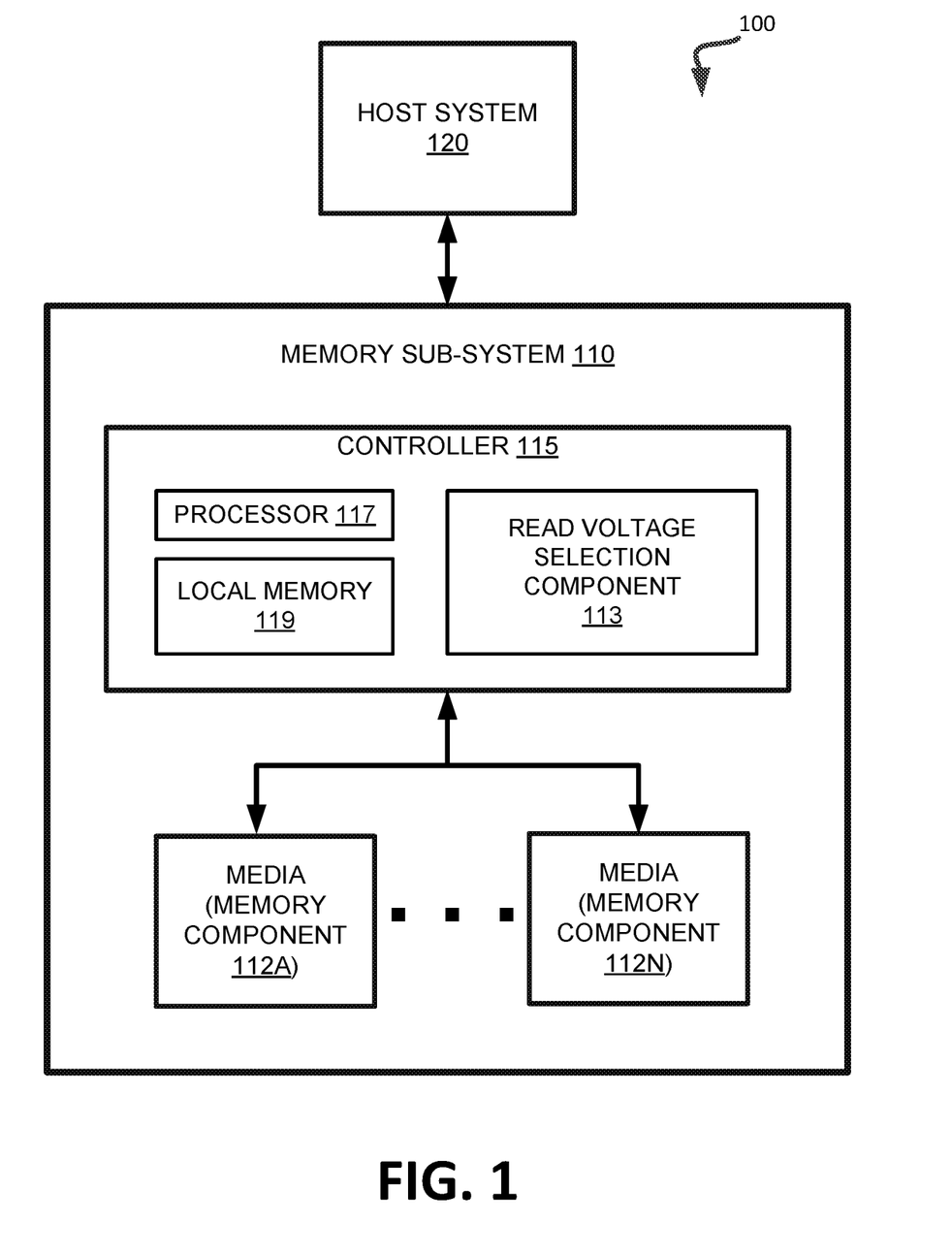
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EE-PROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a read voltage selection component 113 that can select a read voltage level for a read operation using a write transaction catalog. In some embodiments, the controller 115 includes at least a portion of the read voltage selection component 113. For example, the controller 115 can include a processor 117 (processing device) configured to execute instructions stored in local memory 119 for performing the operations described herein. In some embodiments, the read voltage selection component 113 is part of the host system 120, an application, or an operating system.

The write transaction catalog is a data structure that includes entries that store write transaction data, such as the physical addresses associated with write transactions that have occurred within a particular range of W2R delay. The write transaction catalog can be, for example and not limited to, a table or a list. The memory sub-system can perform a lookup operation or a search operation on the write transaction catalog.

The read voltage selection component 113 can search a write transaction catalog for a physical address, or an indication of a physical address, stored in the write transaction catalog. The read voltage selection component 113 can determine if data satisfies a threshold criterion based on the result of the search of the write transaction catalog. The threshold criterion is satisfied if the data was written to the physical address within a threshold period of time. In one embodiment, if the physical address is stored in the write transaction catalog then the data was written to the physical address within the threshold period of time, and thus the threshold criterion may be met. In another embodiment, a time stamp stored with the physical address can indicate whether or not the threshold criterion is satisfied depending on whether data was written to the physical address within the threshold period of time. The read voltage selection component 113 can select a read voltage to read the data at the physical address based on whether the physical address was written to within the threshold period of time. Further details with regards to the operations of the read voltage selection component 113 are described below.

Figure 2:
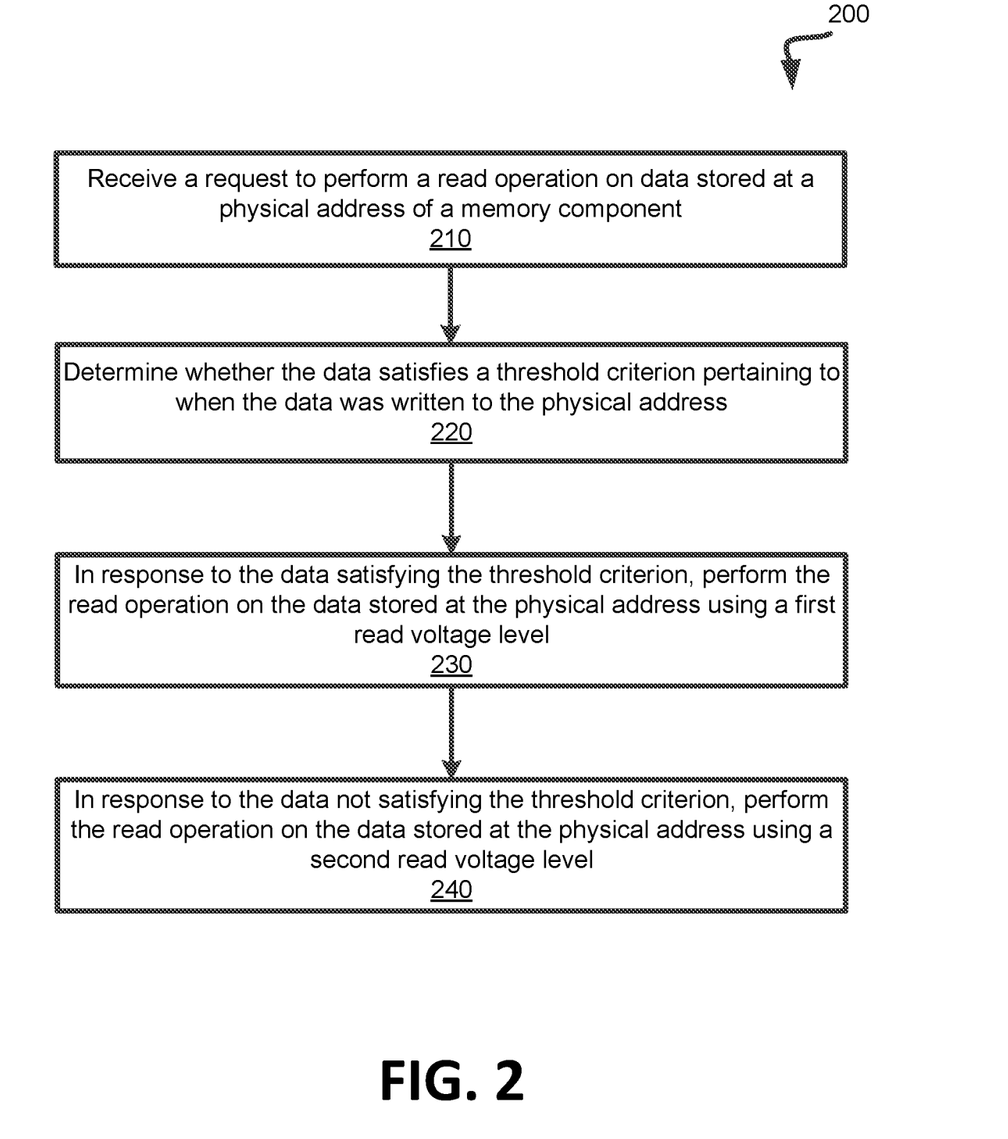
FIG. 2 is a flow diagram of an example method to select a read voltage using write transaction data in accordance with some embodiments of the present disclosure.

FIG. 2 is a flow diagram of an example method 200 to select a read voltage using a write transaction catalog, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the read voltage selection component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic receives a read request to read data stored at a physical address of a memory component (e.g., one of memory components 112A-112N). The read request can include an indicator of the physical address of the memory component to be read. The indicator of the physical address can be a representation of the physical address such as a numerical notation or any other indicator of a physical address of a memory component. The data stored at the physical address can be written at a previous time at which the indicator of the physical address can be recorded in a buffer, referred to as a write transaction catalog. The buffer can be a first-in first-out memory buffer that stores indicators of recently written physical addresses.

At operation 220, the processing logic determines whether the data at the physical address satisfies a threshold criterion pertaining to when the data was written to the physical address. The threshold criterion can be satisfied when the data was written within a threshold period of time. When the time since the data was written exceeds the threshold period of time the threshold criterion is not satisfied. The threshold period of time can be a maximum W2R delay for which a first read voltage level can be used to accurately read the data. The threshold period of time can depend on the memory sub-system and can be selected to provide an optimal threshold at which to begin reading the data using a second read voltage level, as shown in FIG. 3.

Figure 3:
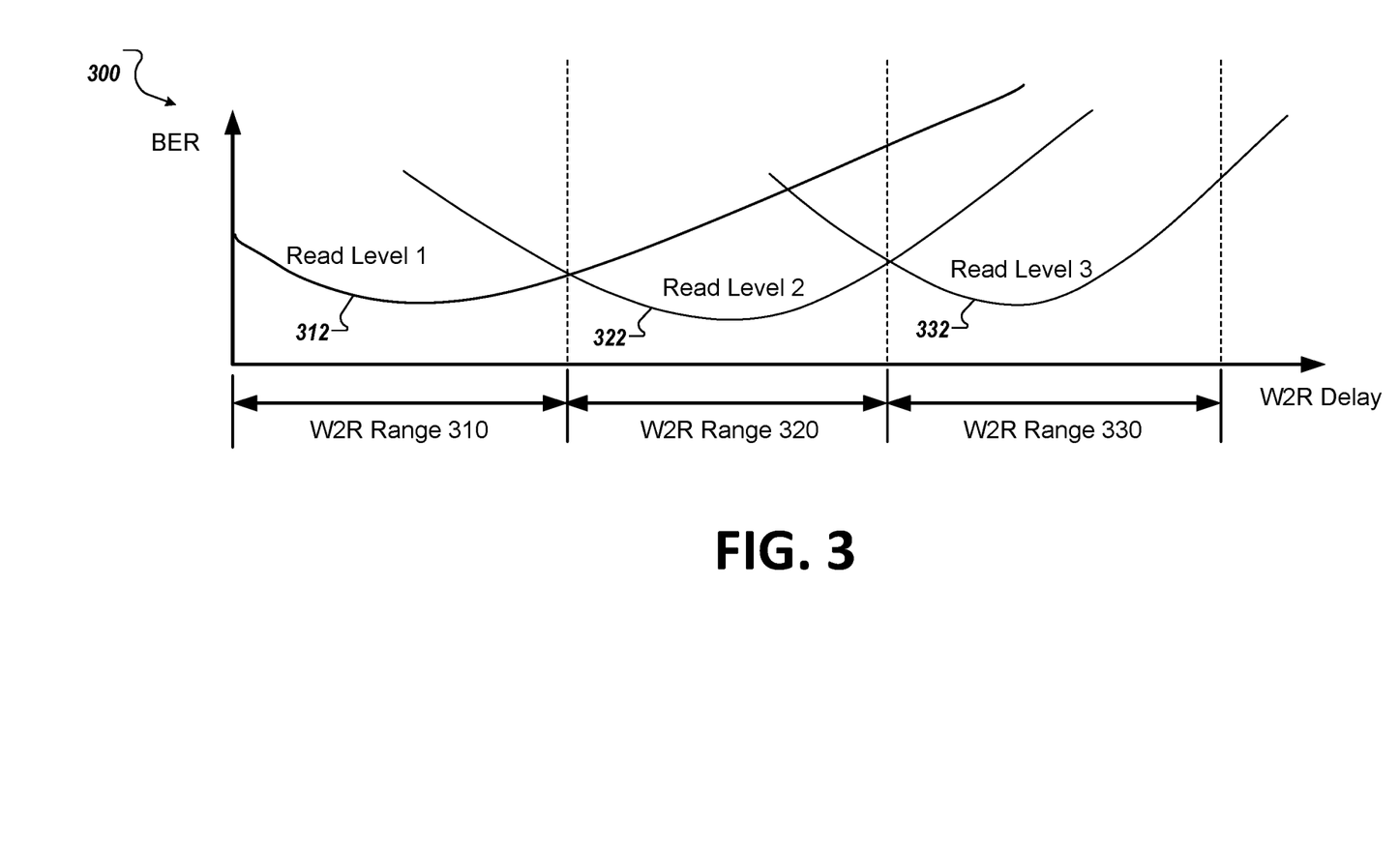
FIG. 3 is a graph that illustrates the bit error rate as a function of write-to-read delay for three read voltage levels in accordance with some embodiments of the present disclosure.

FIG. 3 is a graph 300 that illustrates the bit error rate (BER) as a function of write-to-read (W2R) delay for three read voltage levels in accordance with some embodiments of the present disclosure. As described herein, Vt distributions can shift over time. For example, for a given read voltage level, such as a first read voltage level (labeled Read Level 1), if the Vt distributions move, the bit error rate experienced when read operations are performed using this read voltage level can change as a function of time. In these or other situations, the Vt distribution and bit error rate can be a function of the W2R delay. In graph 300, the measured BER is displayed for read operations performed using a designated read voltage level. For example, BER curve 312 represents the BER measured for read operations performed using Read Level 1 on segments of different W2R delay times, BER curve 322 represents the BER measured for read operations performed using Read Level 2 on segments of different W2R delay times, and BER curve 332 represents the BER measured for read operations performed using Read Level 3 on segments of different W2R delay times. Graph 300 shows that each of the three read voltage levels minimize the BER within a different range of W2R delay times, such as W2R Range 310, W2R Range 320, and W2R Range 330. In other embodiments, there may be any other number of ranges of W2R delay times and associated read voltage levels. The values of Read Level 1, Read Level 2, and Read Level 3 may be set during production of the memory component. The threshold period of time described with respect to FIG. 2 can correspond to W2R Range 310 and the first read voltage level can correspond to Read Level 1. Alternatively, the threshold period of time can be a time that extends beyond W2R Range 310.

Again referring to operation 220 of FIG. 2, the processing logic can search a write transaction catalog to determine if the catalog contains the physical address from the read request. In one embodiment, if the physical address is in the catalog then the physical address was last written within the defined period of time (e.g. W2R Range 310), and the threshold criterion is satisfied. If the physical address is not in the catalog then the physical address was last written outside of the defined period of time (e.g., W2R Range 320 or W2R Range 330), and the threshold criterion is not satisfied. In another embodiment, if the physical address is not in the write transaction catalog, then again the threshold W2R delay is exceeded. However, if the physical address is in the write transaction catalog then the processing logic can also determine whether a time stamp associated with the physical address indicates that the threshold period of time has passed since the data at the physical address was written. The time stamp can be compared to a current time of the read operation to determine if the data at the physical address was written within the threshold period of time.

At operation 230 of FIG. 2, in response to the data satisfying the threshold criterion, the processing logic performs the read operation on the data stored at the physical address using a first read voltage level. At operation 240, in response to the data not satisfying the threshold criterion, the processing logic performs the read operation on the data stored at the physical address using a second read voltage level. The second read voltage level can be higher than the first read voltage level.

Figure 4:
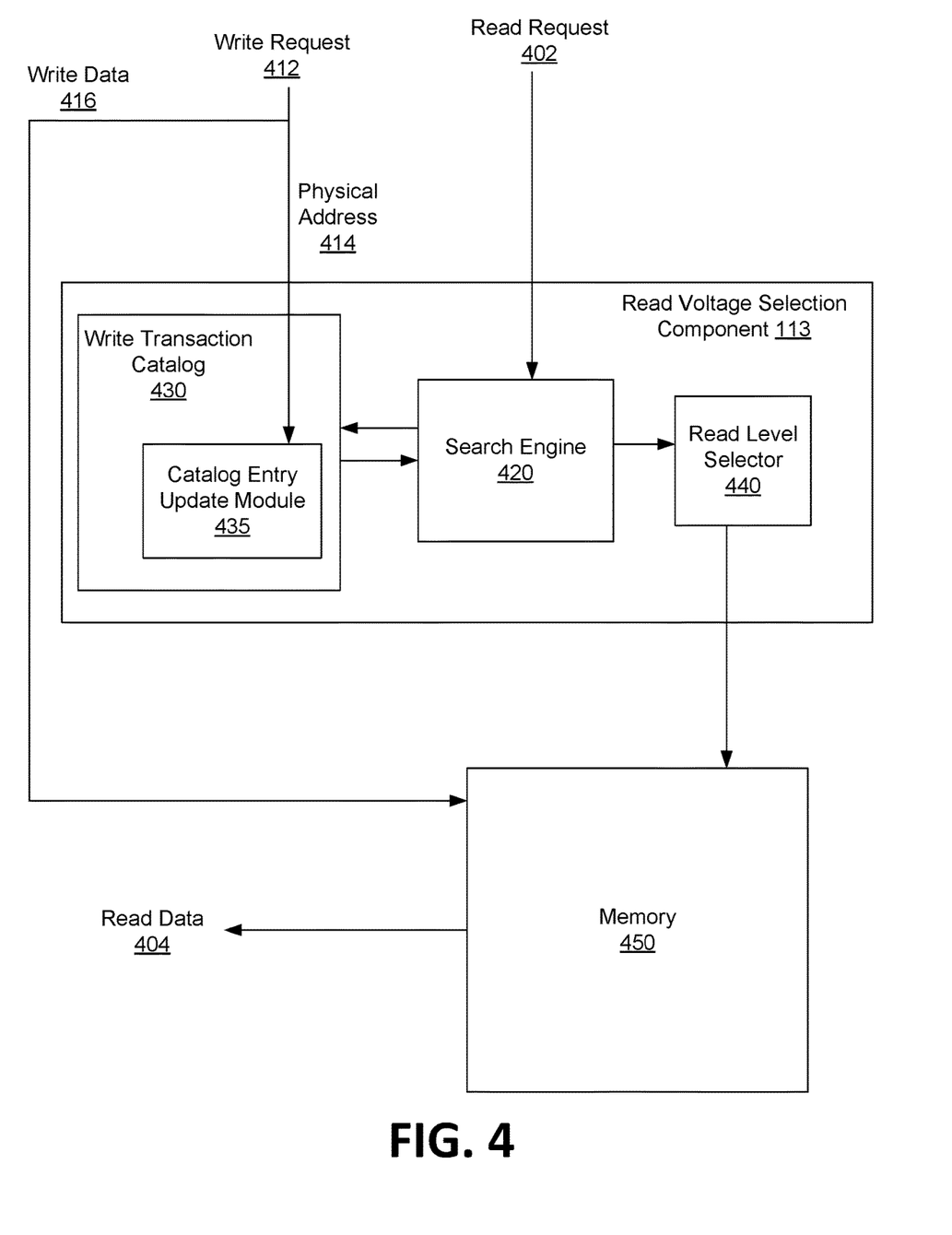
FIG. 4 is a block diagram illustrating an example data flow to select a read voltage using a write transaction catalog in accordance with some embodiments of the present disclosure.

FIG. 4 illustrates a read voltage selection component 113 and a memory 450. The read voltage selection component can include a search engine 420, a write transaction catalog 430 and a read level selector 440. The search engine 420 can be implemented in hardware as a hash, content-addressable memory, or any other hardware search scheme. The search engine 420 can also be implemented, at least in part, by software. The write transaction catalog 430 can store one or more physical addresses of memory 450 to which data has been recently written. Write transaction catalog 430 can also include a catalog entry update module 435 to update the write transaction catalog with newly received physical addresses (e.g., physical address 414) and to remove old entries. The read level selector 440 may be hardware or software that determines, based on the results of a search of the write transaction catalog 430, which read voltage level to use on a first attempt of a read operation.

For example, in one implementation, search engine 420 of the read voltage selection component 113 receives a read request 402 from a host system. The search engine 420 can then search the write transaction catalog 430. The search engine 420 can search the one or more physical addresses stored in the write transaction catalog 430 and the results of the search can be forwarded to the read level selector 440. The read level selector 440 can select a read voltage level based on the result of the search of the write transaction catalog 430. In one example, if the search engine 420 determines that a physical address that is received with the read request 402 is stored in the write transaction catalog 430 then a first read voltage level is selected. If the physical address is not stored in the write transaction catalog 430 then a second read voltage level is selected. In another example, if the physical address is in the write transaction catalog 430 then the read level selector 440 can determine whether a time stamp stored with the physical address in the write transaction catalog 430 indicates that a threshold period of time has elapsed since data was written to the physical address. If the threshold period of time has not elapsed then the first read voltage level is selected. If the threshold period of time has elapsed then the second read voltage level is selected. After selection of a read voltage level the read operation can be executed and return the read data 404 to the host system.

In another example, a physical address 414 of a write request 412 can be received at the catalog entry update module 435 of the write transaction catalog 430. The write request 412 can include both the physical address 414 and write data 416. The physical address 414 of the write request 412 can be stored in the write transaction catalog 430 while the write data 416 is stored at the physical address 414 in memory 450. In some embodiments, the catalog entry update module 435 records the physical address 414 in the write transaction catalog 430 along with a time stamp indicating when the write data 416 was written to memory 450. The catalog entry update module 435 can record the physical address 414, or an indicator of the physical address 414, in an entry of the write transaction catalog 430 adjacent to an entry for the previous write operation. In some embodiments, the write request includes multiple physical addresses 414 for the write data 416. Each physical address 414 of the write data 416 can be recorded in the write transaction catalog 430.

In one embodiment, the write transaction catalog 430 can be a first in first out (FIFO) memory buffer. The catalog entry update module 435 can record the physical addresses in the write transaction catalog 430 with a time stamp and remove a previous entry of the write transaction catalog each time a new physical address is recorded. The write transaction catalog 430 can be a defined size and thus entries can be removed, or overwritten, after a specific number of other physical address have been recorded (i.e., when the buffer is full). In one example, the catalog entry update module 435 can remove the oldest entry of the write transaction catalog 430 each time a new write request is received and replace it with the newly received physical address.

Additionally, in some embodiments, the catalog entry update module 435 can remove an entry from the write transaction catalog 430 at a constant interval. Thus, the physical address 414 is stored in the write transaction catalog 430 for the threshold amount of time (i.e. the threshold W2R delay) and is then removed. For example, the catalog entry update module 435 can include a write pointer of the write transaction catalog 430 that is incremented to the next entry position in the write transaction catalog 430 at the constant interval. At each constant interval an entry at the position indicated by the write pointer is removed. In addition, if a write request is received during the interval then the removed entry can be replaced by the physical address for the newly received write request. The write pointer is then incremented whether or not a write request is received. Therefore, in a write transaction catalog 430 of a defined size, the physical address 414 can be recorded without a time stamp.

Figure 5:
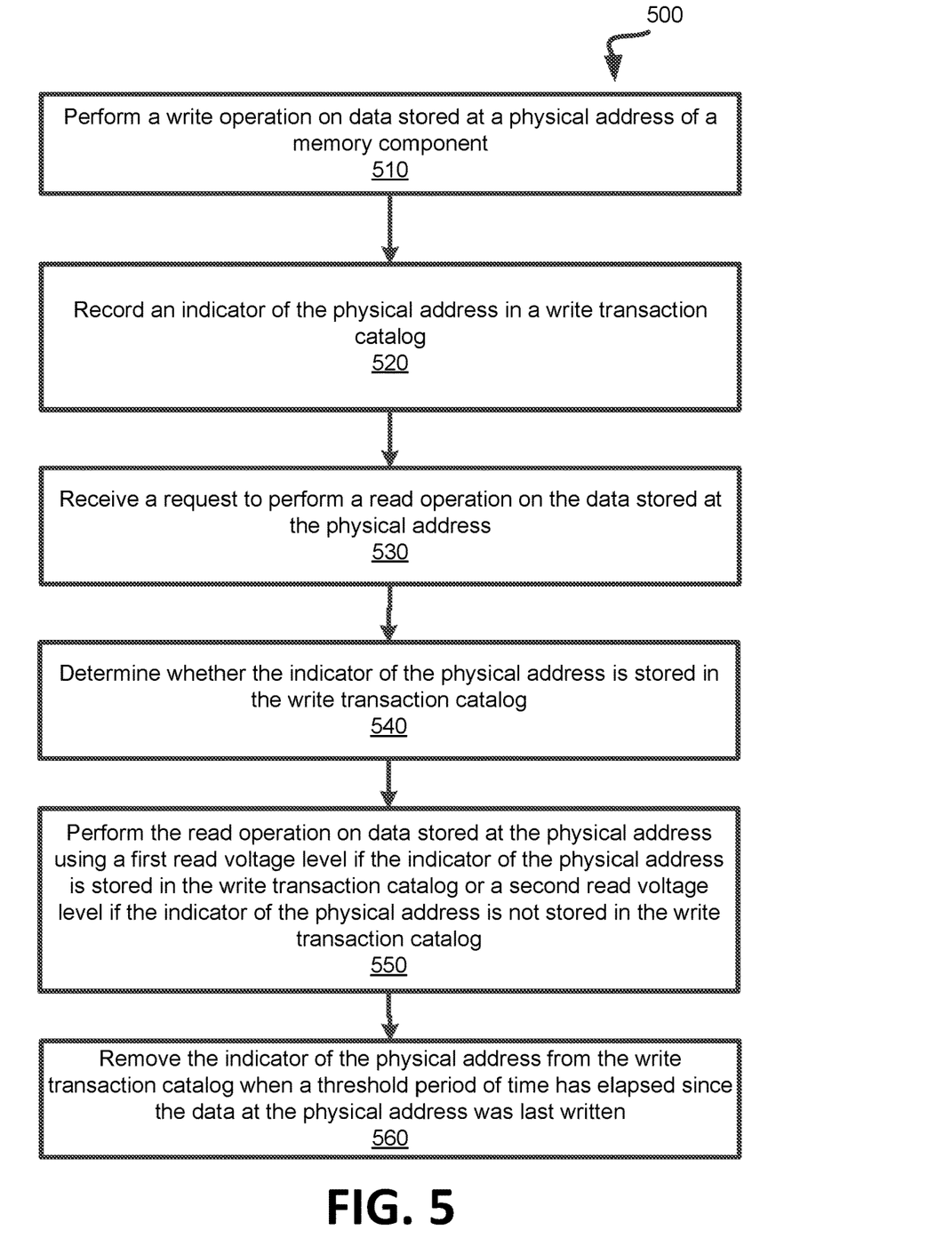
FIG. 5 is a flow diagram of an example method to select a read voltage using a write transaction catalog in accordance with some embodiments of the present disclosure.

FIG. 5 is a flow diagram of an example method 500 to select a read voltage using a write transaction catalog, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the read voltage selection component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic performs a write operation on memory located at a physical address of a memory component. The write operation may include data to be written to the memory component and the physical address. The physical address can be an indicator of the physical location of the memory in which the data is to be stored (such as a numerical address representative of the physical location, etc.). The data can then be written to the memory at the physical address of the write operation. At operation 520, the processing logic records the physical address in a write transaction catalog. The write transaction catalog can be a memory buffer that records each of the physical addresses written in memory. In one embodiment, the write transaction catalog is a first-in first-out memory buffer that records the physical addresses of incoming write operations and removes the oldest physical address in the buffer each time a new address is recorded. Each physical address can be recorded with a time stamp for the time when the write operation occurred. In another embodiment, a write pointer of the write transaction catalog increments to a next entry position each time a specific time interval elapses. The specific time interval can be a minimum write interval (i.e., the shortest amount of time a single write transaction can occur).

At operation 530, the processing logic receives a request to perform a read operation on the memory at the physical address. The read operation can include the physical address of the memory to be read. The physical address can be received at a read voltage selection component to determine a read voltage to use to read the data at the physical address. At operation 540, the processing logic determines whether the physical address is stored in a write transaction catalog. A search engine implemented in hardware (e.g., a hash, or content addressable memory) can be used to search the recent write transaction for an entry with the physical address.

At operation 550, the processing logic reads the memory at the physical address using a first read voltage level in response to determining that the physical address is stored in the write transaction catalog and a second read voltage level can be used if the physical address is not stored in the write transaction catalog. The first read voltage level can be a lowest read voltage level of multiple read voltage levels. For example, there can be a first read voltage level (lowest), a second read voltage level (middle), and a third read voltage level (highest). The different read voltage levels can be used for data that has different W2R delays. The first read voltage level can be used to read data within a first range of W2R delays. The second read voltage level can be used to read data within a second range of W2R delays. The third read voltage level can be used to read data within a third range of W2R delays. In another example, if the W2R delay exceeds a threshold (e.g., is within the second or third ranges) then the second read voltage level can be used to attempt to read the data. If a read error occurs when using the second read voltage level then the third read voltage level can be used to read the data. At operation 560, the processing logic removes the physical address from the write transaction catalog when a W2R delay of the data at the physical address exceeds a threshold W2R delay.

Figure 6A:
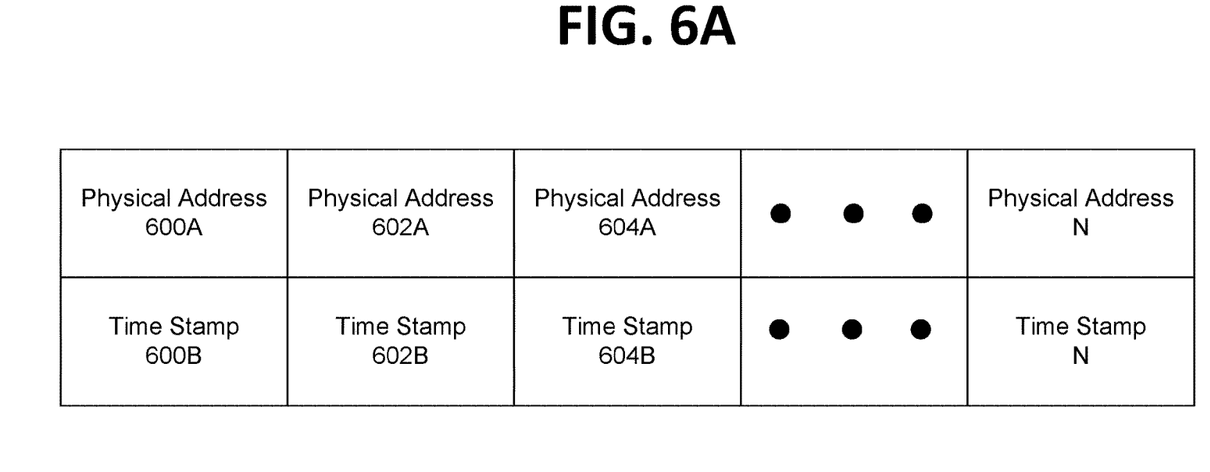
FIG. 6A illustrates an example write transaction catalog according to some embodiments of the present disclosure.

FIG. 6A illustrates an example write transaction catalog for use in selecting a read voltage level, according to one embodiment. The write transaction catalog can store one or more physical addresses 600A-N of memory on which a write operation has been performed. In one example, when a write operation is received and/or performed a time stamp is recorded along with the physical address that the write operation is to be performed on. For example, physical address 600A can be recorded along with time stamp 600B when a write operation to be performed on physical address 600A is received and/or performed.

In one embodiment, the write catalog is a first-in first-out buffer. A write pointer for the buffer can be used to select the entry of the buffer in which to record a physical address and timestamp of a write operation. The write pointer can be incremented each time a write operation is received. Thus, the write transaction catalog can record physical addresses of write operations adjacently as they are received. For example, upon receiving a first write operation, the physical address 600A and time stamp 600B can be recorded. Next, a second write operation can be received and the physical address 602A and 602B can be recorded adjacent to physical address 600A and 600B regardless of how much time has elapsed between the write operations. A third write operation can be received and physical address 604A and time stamp 604B can be recorded adjacent to the physical address 602A and timestamp 602B of the previous write operation.

In addition, upon receiving a read operation the write transaction catalog can be searched to determine if the physical address to be read is recorded therein. If the physical address is found in the write transaction catalog then the timestamp recorded with the physical address is used to determine if a W2R delay of the physical address is larger than a defined threshold. If the W2R delay is less than the defined threshold then a first read voltage level can be used to read the data at the physical address in memory. If the W2R delay is larger than the defined threshold then a second read voltage level can be used to read the data at the physical address in memory. The second read voltage can be higher than the first read voltage. Additionally, if the physical address is not in the write transaction catalog then the second read voltage level can be used.

Figure 6B:
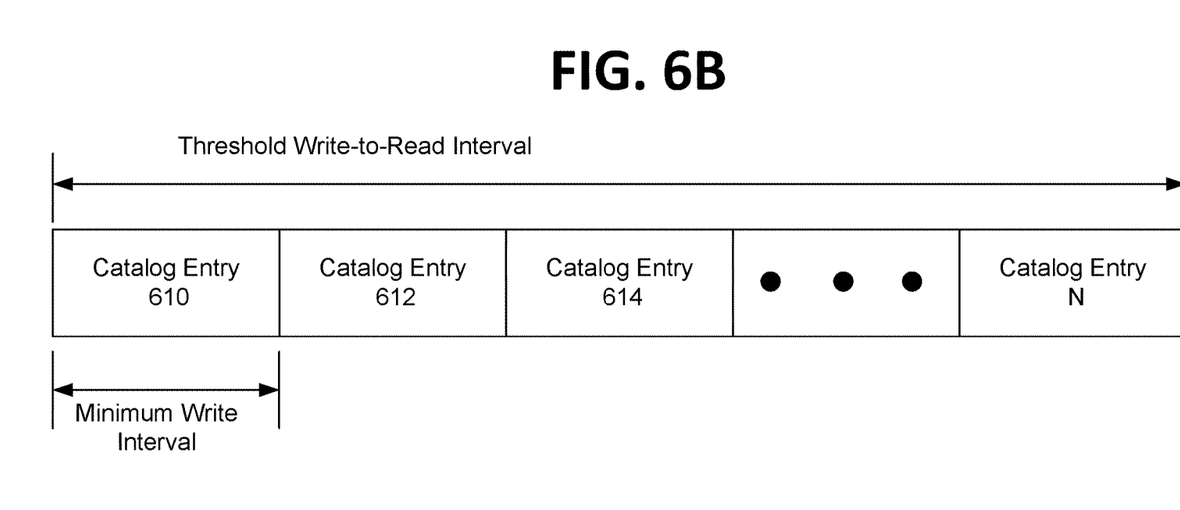
FIG. 6B illustrates an example write transaction catalog according to some embodiments of the present disclosure.

FIG. 6B depicts an example write transaction catalog according to one embodiment. A write pointer can be used to select which entry of the write transaction catalog that a received physical address is recorded in. The write pointer can be incremented to the next entry position at the same rate as a maximum write rate of the memory sub-system, or in other words every time a minimum write interval elapsed. The minimum write interval can be the smallest period of time over which a write operation can occur. At each minimum write interval, if a write operation is received then the physical address of the write operation is recorded in the write transaction catalog according to the position of the write pointer at that time. The write pointer can continue to increment at every minimum write interval even if a write operation is not received.

Since the write pointer increments at every minimum write interval, the size of the write transaction catalog can be determined by the threshold W2R interval and vice versa. The threshold W2R interval divided by the minimum write interval can provide the number of possible entries in the write transaction catalog. Thus, in one embodiment, when a read operation is received, the write transaction catalog can be searched for a physical address from the read operation. If the physical address is in the write transaction catalog then the W2R delay of the physical address is less than the threshold W2R interval. Therefore, a first read voltage level can be used to read the data at the physical address. Otherwise, if the physical address is not found in the write transaction catalog then the W2R delay is larger than the threshold W2R interval. If the W2R delay is larger than the threshold W2R interval, then a second read voltage level can be used to read the data at the physical address.

For example, a write pointer can begin by pointing to the position in the write transaction catalog corresponding to catalog entry 610. At that time a write operation is not received and therefore it remains empty. Once the minimum write interval elapses, the write pointer increments to the position corresponding to physical address 612 at which point a write operation is received. The physical address of the write operation can then be recorded at catalog entry 612. After another minimum write interval has elapsed the write pointer increments again to catalog entry 614. The same process continues until the write pointer reaches the end of the catalog (e.g., catalog entry N). Then the write pointer goes back to the beginning of the write transaction catalog at catalog entry 610. Using this method the threshold W2R interval can be defined by the number of entries in the write transaction catalog. Therefore, if a physical address is in the write transaction catalog the data at the physical address was written to within the threshold W2R interval.

Figure 7:
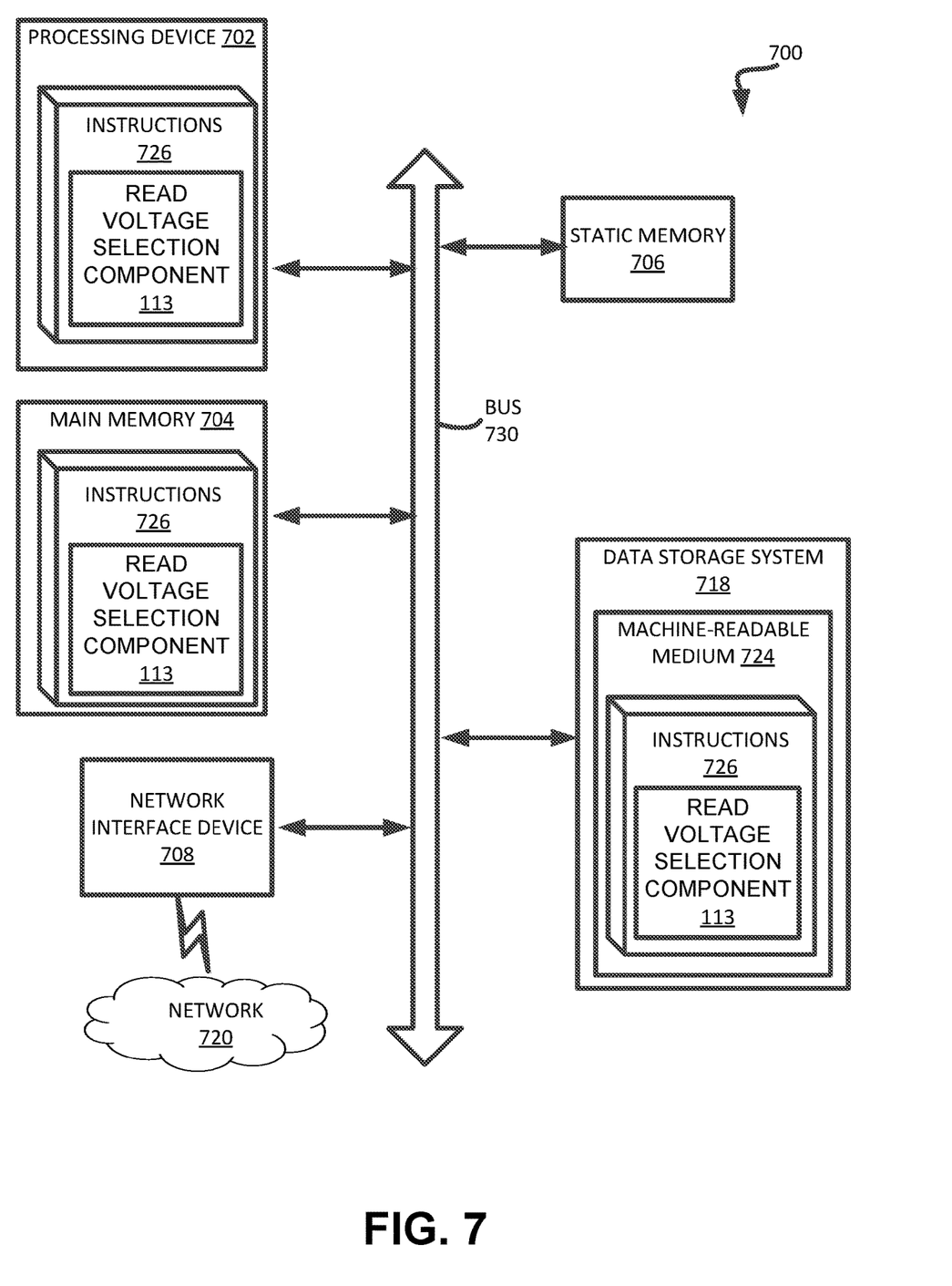
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read voltage selection component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a read voltage selection component (e.g., the read voltage selection component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory component; and
   a processing device, operatively coupled with the memory component, to perform operations comprising:
      receiving a read request on data stored at a physical address of the memory component;
      determining whether an indicator of the physical address is stored in a write transaction catalog;
      reading the data stored at the physical address using a first read voltage level in response to determining that the physical address is stored in the write transaction catalog;
      reading the data stored at the physical address using a second read voltage level in response to determining that the physical address is not stored in the write transaction catalog, wherein the second read voltage level is higher than the first read voltage level; and
      reading the data stored at the physical address using a third read voltage level in response to determining that the physical address is not stored in the write transaction catalog and that a read error occurred in response to reading the data stored at the physical address using a second read voltage level, wherein the third read voltage level is higher than the second read voltage level.

2. The system of claim 1, wherein the processing device is to perform further operations comprising:
   searching the write transaction catalog for an entry corresponding to the physical address; and
   determining whether a time stamp associated with the entry corresponding to the physical address in the write transaction catalog indicates that the data stored at the physical address satisfies a threshold criterion.

3. The system of claim 2, wherein to determine whether the time stamp indicates that the data stored at the physical address satisfies the threshold criterion, the processing device is to perform further operations comprising:
   determining a difference between a current time and the time stamp, wherein the difference represents a write to read delay of the data stored at the physical address; and
   comparing the difference to a threshold.

4. The system of claim 1, wherein the write transaction catalog stores a plurality of entries corresponding to a plurality of physical addresses of memory that satisfy a threshold criterion.

5. The system of claim 4, wherein the processing device is to perform further operations comprising:
   recording the physical address in the write transaction catalog upon performing a write operation to write the data to the physical address; and
   removing the physical address from the write transaction catalog after a threshold criterion is not satisfied.

6. The system of claim 5, wherein a write pointer determines which entry of the write transaction catalog to use to record the physical address, and wherein the write pointer is updated to point to a subsequent entry of the write transaction catalog after a specified period of time.

7. The system of claim 6, wherein the write pointer is updated after the specified period of time independent of whether another write operation is received during the specified period of time.

8. A method comprising:
   performing a write operation on data stored at a physical address of a memory component;
   recording an indicator of the physical address in a write transaction catalog;
   receiving a request to perform a read operation on the data stored at the physical address;

determining whether the indicator of the physical address is stored in the write transaction catalog;
reading the data stored at the physical address using a first read voltage level in response to determining that the physical address is stored in the write transaction catalog;
reading the data stored at the physical address using a second read voltage level in response to determining that the physical address is not stored in the write transaction catalog, wherein the second read voltage level is higher than the first read voltage level; and
reading the data stored at the physical address using a third read voltage level in response to determining that the physical address is not stored in the write transaction catalog and that a read error occurred in response to reading the data stored at the physical address using a second read voltage level, wherein the third read voltage level is higher than the second read voltage level.

9. The method of claim 8, further comprising:
determining that the data does not satisfy a threshold criterion pertaining to when the data was written to the physical address; and
removing the physical address from the write transaction catalog.

10. The method of claim 8, wherein determining whether the physical address is stored in the write transaction catalog comprises:
searching the write transaction catalog using a hardware hashing scheme or content addressable memory.

11. The method of claim 8, wherein the write transaction catalog comprises a first in first out memory buffer and wherein an oldest entry of the write transaction catalog is removed when a minimum write interval elapses.

12. The method of claim 11, wherein at the minimum write interval a new physical address is recorded in the write transaction catalog if a new write operation is received.

13. The method of claim 8, wherein a timestamp is recorded with the physical address when the write operation is executed, wherein the timestamp is used to determine whether a threshold criterion pertaining to when the data was written to the physical address is satisfied.

14. A non-transitory computer readable storage medium comprising instructions that, when executed by a processing device, cause the processing device to:
receiving a read request on data stored at a physical address of the memory component;
determining whether an indicator of the physical address is stored in a write transaction catalog;
reading the data stored at the physical address using a first read voltage level in response to determining that the physical address is stored in the write transaction catalog;
reading the data stored at the physical address using a second read voltage level in response to determining that the physical address is not stored in the write transaction catalog, wherein the second read voltage level is higher than the first read voltage level; and
reading the data stored at the physical address using a third read voltage level in response to determining that the physical address is not stored in the write transaction catalog and that a read error occurred in response to reading the data stored at the physical address using a second read voltage level, wherein the third read voltage level is higher than the second read voltage level.

15. The non-transitory computer readable storage medium of claim 14, wherein the processing device is to perform further operations comprising:
searching the write transaction catalog for an entry corresponding to the physical address using content addressable memory; and
determining whether a time stamp associated with the entry corresponding to the physical address in the write transaction catalog indicates that the data stored at the physical address satisfies a threshold criterion.

16. The non-transitory computer readable storage medium of claim 15, wherein to determine whether the time stamp indicates that the data stored at the physical address satisfies the threshold criterion, the processing device is to perform further operations comprising:
determining a difference between a current time and the time stamp, wherein the difference represents a write to read delay of the data stored at the physical address; and
comparing the difference to the threshold criterion.

17. The non-transitory computer readable storage medium of claim 14,
wherein the write transaction catalog stores a plurality of entries corresponding to a plurality of physical addresses of memory that satisfy a threshold criterion.

18. The non-transitory computer readable storage medium of claim 14, wherein the processing device is to perform further operations comprising:
recording the physical address in the write transaction catalog upon performing a write operation to write the data to the physical address; and
removing the physical address from the write catalog after a threshold criterion is exceeded.

19. The non-transitory computer readable storage medium of claim 18, wherein a write pointer determines in which entry of the write transaction catalog the physical address will be recorded, and wherein the write pointer is updated to point to a subsequent entry of the write transaction catalog after a specified period of time.

* * * * *